United States Patent [19]

Akiki et al.

[11] Patent Number: 5,294,883
[45] Date of Patent: Mar. 15, 1994

[54] TEST DETECTOR/SHUTOFF AND METHOD FOR BICMOS INTEGRATED CIRCUIT

[76] Inventors: Jeanine F. Akiki, Williston, Charles W. Hanson, Milton, both of Vt.

[73] Assignee: International Business Machines Corporation, Armonk, N.Y.

[21] Appl. No.: 925,348

[22] Filed: Aug. 4, 1992

[51] Int. Cl.⁵ .................................... G01R 31/28
[52] U.S. Cl. ...................... 324/158 R; 324/73.1
[58] Field of Search .............. 324/73.1, 158 R, 522, 324/158 T; 371/21.2, 22.3, 15.1, 16.1; 307/446; 437/8; 257/48

[56] References Cited

U.S. PATENT DOCUMENTS

| | | | |
|---|---|---|---|
| 4,336,495 | 6/1982 | Hapke | 324/158 T |
| 4,398,146 | 8/1983 | Draheim et al. | 324/73 R |
| 4,628,253 | 12/1986 | Yu et al. | 324/73 R |
| 4,714,876 | 12/1987 | Gay et al. | 324/73 R |
| 4,733,168 | 3/1988 | Blankenship et al. | 324/73 R |
| 4,779,041 | 10/1988 | Williamson, Jr. | 324/73 PC |
| 4,967,151 | 10/1990 | Barish et al. | 324/158 T |
| 4,970,454 | 11/1990 | Stambaugh et al. | 324/73.1 |
| 5,012,185 | 4/1991 | Ohfuji | 324/158 R |
| 5,019,772 | 5/1991 | Dreibelbis et al. | 324/158 R |
| 5,030,904 | 7/1991 | Tanksalvala et al. | 324/158 R |

FOREIGN PATENT DOCUMENTS 63-186462 8/1988 Japan .
1-52298 2/1989 Japan .
1-321382 12/1989 Japan .

OTHER PUBLICATIONS

Gray, K. S. and Kosson, J. S., "Delay Margin Testing Circuit for CMOS Circuitry" in IBM Technical Disclosure Bulletin, vol. 29, No. 10, Mar. 1987.

Primary Examiner—Vinh Nguyen

[57] ABSTRACT

A test detect and shut off circuit for a BiCMOS integrated circuit is presented. The test detector/shutoff detects the presence of a predetermined test condition in the BiCMOS integrated circuit (IC), and upon detection of the predetermined condition isolates (i.e., switches off) the bipolar circuit portion from the CMOS logic portion of the BiCMOS IC. In this way, bias current in the bipolar transistor circuit is eliminated, thereby facilitating IDD testing of the BiCMOS logic. The detector/shutoff is particularly designed for BiCMOS implementations wherein a single voltage rail supplies voltage $V_{DD}$ to the logic and bipolar circuit portions of the IC. Corresponding test detect and circuit isolation methods are also presented.

14 Claims, 4 Drawing Sheets

TEST DETECTOR/SHUTOFF AND METHOD FOR BICMOS INTEGRATED CIRCUIT

TECHNICAL FIELD

This invention relates to the testing of BiCMOS integrated circuits (ICs), and more particularly, to a detector/shutoff circuit for facilitating accurate IDD testing off BiCMOS logic by isolating books with high standby current from circuit logic prior to testing thereof. The technique is employed where a common power rail is used to supply operating voltage $V_{DD}$ to both logic and bipolar circuit portions of the BiCMOS IC.

BACKGROUND ART

In the semiconductor fabrication industry, it is necessary to test an integrated circuit during fabrication by pre-testing and after fabrication by final testing, in order to obtain better detection of any defects occurring therein. However, as the degree of integration and complexity of integrated circuits continues to increase, the number of external connections available has not kept pace so that it has become more and more difficult to test complex integrated circuits.

Complicating testing of BiCMOS ICs is the need to isolate BiCMOS logic from the bipolar circuits during certain testing processes. Also, multiple bipolar circuit pathways may be coupled between supply voltage $V_{DD}$ and an intermediate supply voltage $V_{TT}$, wherein $V_{DD} > V_{TT} > GND$. (Typically, today's BiCMOS devices operate with a 3.6 volts $V_{DD}$ supply voltage and a 1.5 volts $V_{TT}$ supply voltage.) Further, because of a limitation on the number of connections available, a BiCMOS integrated circuit may have CMOS logic coupled in parallel with certain bipolar circuits between an operating circuit voltage $V_{DD}$ and a ground potential. These bipolar circuits (such as ECL I/O circuits) commonly have a high standby current.

One well known circuit test in the semiconductor fabrication art is the "IDD test" or "IDD current test". This test attempts to measure the quiescent current of a chip between supply voltage $V_{DD}$ and ground potential GND. The test is conventionally used to screen early AC,DC and reliability defects in CMOS and BiCMOS logic parts. Industry standards are well established for IDD current test measurements and various articles are available in the open literature which describe the testing process. Essentially the test seeks to determine the extent of leakage current through the BiCMOS logic. The amount of leakage current is recognized as an indication of the quality of a chip. The lower the magnitude of the leakage current, the better the chip quality.

In the BiCMOS environment, the IDD test is traditionally conducted on a per cycle/per pattern basis on internal logic circuits with separate power busing for the bipolar circuits, i.e., separate voltage rails are employed to separately supply voltage $V_{DD}$ to the logic and to the bipolar circuits. Because separate power supply rails are used, leakage current through the logic circuits is obviously isolated from standby current through the bipolar circuits, which is normally at least an order of magnitude higher than the leakage current. In this configuration, isolation is ensured by removing the supply voltage $V_{DD}$ at the voltage rail supplying the bipolar circuits. Unfortunately, in view of ever increasing integrated circuit complexity, many BiCMOS circuit designs must utilize a common pin for supplying voltage $V_{DD}$ to the bipolar circuit pathways and to the internal logic.

Again, bipolar circuit bias current is typically much higher than leakage current in the BiCMOS logic portion of a semiconductor chip. (For example, in BiCMOS logic designs, IDD current is typically on the order of microamps while bipolar circuit bias current is in the range of milliamps.) In the common power supply rail embodiment, the high currents drawn by the I/O related bipolar circuits make it difficult during IDD testing to detect the low level quiescent IDD currents of the BiCMOS logic coupled in parallel therewith. Therefore, a recognized need exists in such circuits to isolate the bipolar circuit pathways from the parallel coupled BiCMOS logic pathways for accurate testing thereof.

One prior attempt to address this problem is described in Japanese Patent No. 63-186462 entitled "Semiconductor Integrated Circuit". In this patent, a BiCMOS integrated circuit is presented which allows measurement of only the power source current of a CMOS circuit by providing a switching circuit to cut off the power source current of the bipolar circuit portion at the time of the test processing. A MOSFET switching circuit is described which is responsive to an applied signal at a dedicated test terminal. By applying an appropriate voltage at the test terminal, switching of the bipolar circuit can be obtained, i.e., power source current can be made to flow only in the CMOS circuit portion of the BiCMOS IC. The disadvantage to the approach, however, remains the need to dedicate an additional terminal (i.e., the test terminal) to attain the desired isolation of the CMOS logic.

Therefore, a need exists in the industry for a means for shutting off IDD current through bipolar circuits coupled in parallel with BiCMOS logic between supply voltage $V_{DD}$ and ground potential GND. Such selective isolation would allow meaningful IDD testing in a BiCMOS environment without the addition of an extra terminal to accomplish the test.

DISCLOSURE OF INVENTION

Briefly summarized, in one aspect a test detect and shut off circuit for facilitating testing of a BiCMOS integrated circuit is provided. The BiCMOS integrated circuit has a single first power rail supplying operating circuit voltage $V_{DD}$ and a second power rail supplying intermediate voltage $V_{TT}$ (wherein $V_{DD} > V_{TT}$). The IC includes a logic circuit portion connected between the first power rail supplying voltage $V_{DD}$ and a ground voltage GND. In addition, the BiCMOS circuit includes a bipolar transistor circuit having multiple current paths at least one of which is connected in parallel with the logic portion between the first power rail supplying voltage $V_{DD}$ and the ground voltage GND. Further, at least one of the multiple current paths through the bipolar transistor circuit portion is connected between the first power rail supplying voltage $V_{DD}$ and the second power rail supplying intermediate voltage $V_{TT}$. The detect/shutoff circuitry includes a detect circuit for detecting the presence of a predetermined test condition in the BiCMOS IC, and for generating in response thereto a test detect signal. A shut off circuit is responsive to the test detect signal and opens the bipolar transistor circuit current pathways connected between the first power rail supplying voltage $V_{DD}$ and the ground voltage GND upon generation of the test detect signal. Thus, bias current in the bipolar transistor circuit pathways is eliminated, thereby facilitating testing of the BiCMOS logic.

In another aspect, a BiCMOS integrated circuit having a test detect and bipolar circuit shut off for facilitating IDD testing of BiCMOS logic is provided. The integrated circuit includes a first power input for supplying operating circuit voltage $V_{DD}$ to the BiCMOS integrated circuit. A field effect transistor circuit is connected between the first power input supplying voltage $V_{DD}$ and a ground voltage GND. A bipolar transistor circuit is also provided having multiple current pathways connected in parallel with the field effect transistor circuit between the first power input supplying voltage $V_{DD}$ and the ground voltage GND. A second power input supplies an intermediate circuit voltage $V_{TT}$ (wherein $V_{DD} > V_{TT} >$ GND) to a portion of the bipolar transistor circuit connected between the first power input supplying voltage $V_{DD}$ and the second power input supplying voltage $V_{TT}$. Finally, detect/shutoff circuitry is provided for detecting the presence of a predetermined test condition in the BiCMOS integrated circuit. Upon detection of the predetermined condition, the shutoff circuitry switches off the bipolar transistor circuit current pathways connected between the first power input supplying voltage $V_{DD}$ and the ground voltage GND so that standby current in the pathways is eliminated and IDD testing of the BiCMOS logic is facilitated.

In a further aspect of the present invention, a method for isolating a selected portion of a BiCMOS integrated circuit for IDD testing is set forth. The integrated circuit includes a logic transistor circuit and an I/O transistor circuit. The logic transistor circuit and a first portion of the I/O transistor circuit are coupled in parallel between an operating circuit supply voltage $V_{DD}$ and a ground voltage GND. A second portion of the I/O transistor circuit is connected between the supply voltage $V_{DD}$ and a second intermediate supply voltage $V_{TT}$ (wherein $V_{DD} > V_{TT}$). The method includes the steps of: reducing the voltage difference between the operating supply voltage $V_{DD}$ and the intermediate supply voltage $V_{TT}$ so as to disable the I/O transistor circuit second portion connected therebetween; detecting a predefined minimum threshold voltage difference between the supply voltage $V_{DD}$ and the supply voltage $V_{TT}$; and in automatic response thereto, disabling the I/O transistor circuit first portion coupled between the supply voltage $V_{DD}$ and the ground voltage GND while the voltage difference is below the minimum predefined threshold. Thus, testing of the logic transistor circuit may proceed independent of the I/O transistor circuit portions.

To summarize, a novel IDD test detect/shutoff technique for BiCMOS devices is presented herein. This test detect/shutoff approach allows the performance of meaningful IDD testing of a chip having a common power rail for both CMOS logic and certain bipolar circuit pathways (e.g., ECL I/Os). The innovative technique, which will improve chip reliability and chip yield, requires minimal cost to implement since the monitor/shutoff circuit may be embedded in an I/O cell, thereby requiring minimal chip image redesign.

BRIEF DESCRIPTION OF DRAWINGS

These and other objects, advantages and features of the present invention will be more readily understood from the following detailed description of certain preferred embodiments of the present invention, when considered in conjunction with the accompanying drawings in which.

BEST MODE FOR CARRYING OUT THE INVENTION

Reference is now made to the drawings in which the same reference numbers are used throughout the different figures to designate the same or similar components.

Figure 1:
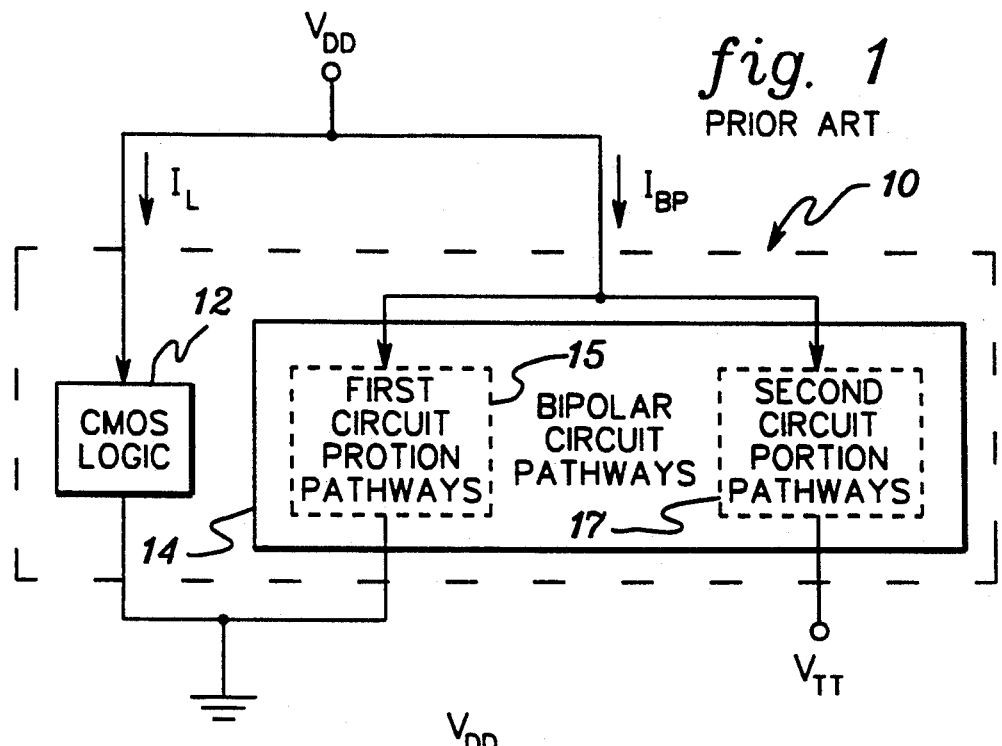
FIG. 1 is a generalized diagram of a BiCMOS circuit having CMOS logic coupled in parallel with bipolar circuit pathways, between circuit supply voltage $V_{DD}$ and a ground potential.

FIG. 1 generally depicts a BiCMOS circuit 10 including a CMOS logic portion 12 and a bipolar circuit portion 14. CMOS logic 12 and a first circuit portion 15 of bipolar circuit pathways 14 are coupled in parallel between a common voltage supply rail $V_{DD}$ (e.g., 3.6V) and a ground voltage GND. In addition to those bipolar pathways in parallel with logic 12, certain pathways 17 through bipolar circuit pathways 14 are connected between supply voltage $V_{DD}$ and an intermediate voltage supply $V_{TT}$ (e.g., 1.5V). Pathways 17 are referred to herein as a second circuit portion of bipolar circuit pathways 14. Voltage $V_{TT}$ normally comprises a reference voltage. (For example, this voltage may be the value at which ECL drivers switch.) Thus, a single power rail for supplying voltage $V_{DD}$ is employed, as well as a single power rail for supplying voltage $V_{TT}$. Again, I/O pin connections are normally at a premium in today's integrated circuit designs.

Since both logic 12 and circuits 14 share a common power drive ($V_{DD}$), current flow from $V_{DD}$ to ground branches as a logic current component $I_L$ through CMOS logic 12 and a bipolar current component $I_{BP}$ through bipolar circuits 14. As noted above, IDD current testing attempts to measure quiescent current of a chip's logic between supply voltage $V_{DD}$ and ground. Therefore, to facilitate the test it is desirable to shut off current through bipolar circuits 14 during testing, since this current would mask the very low IDD current in the parallel connected BiCMOS logic (i.e., CMOS logic 12 of integrated circuit 10). (This assumes current is being measured at the $V_{DD}$ power supply rail.)

Figure 2:
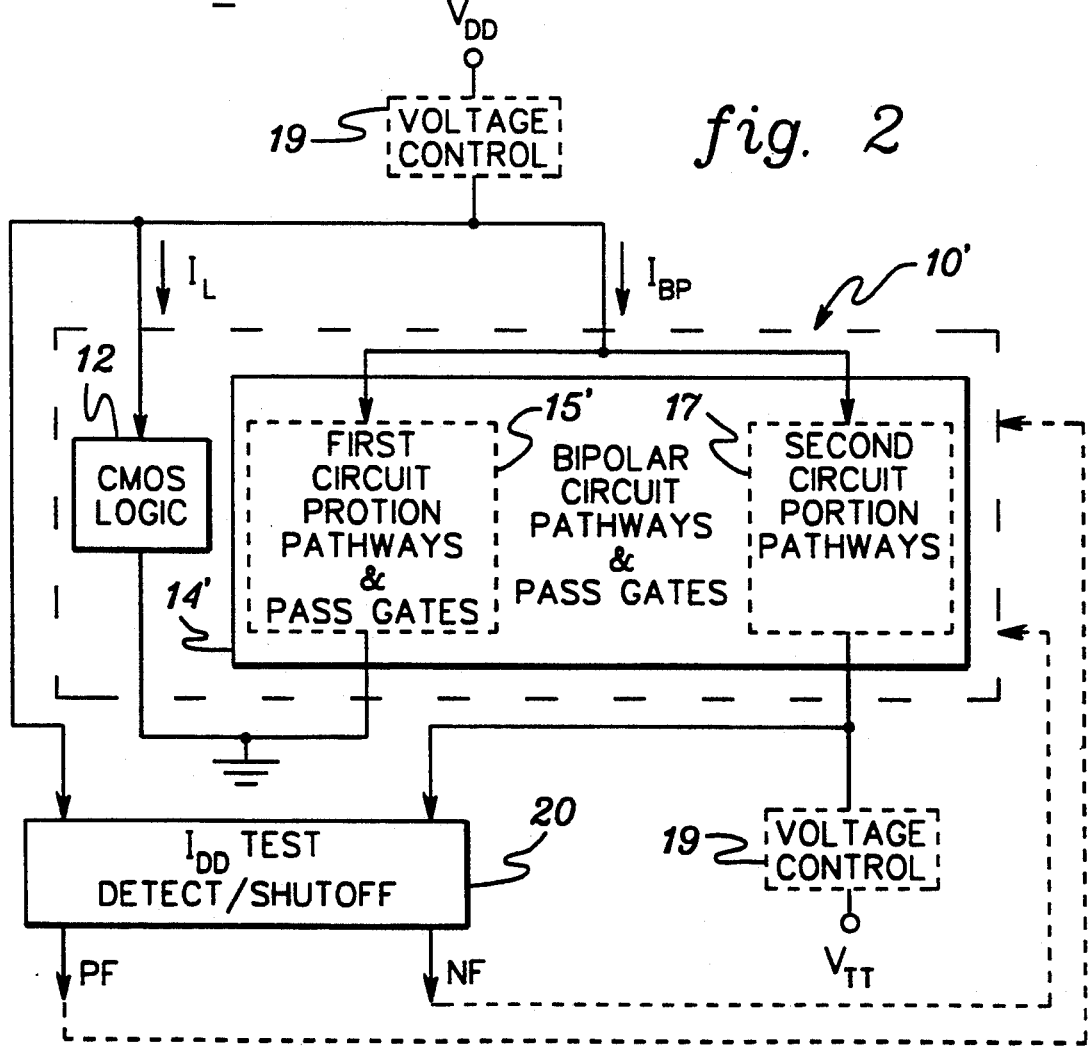
FIG. 2 is a block diagram of an IDD test detect and shut off circuit pursuant to the present invention connected to the BiCMOS circuit of FIG. 1.

One embodiment of a modified BiCMOS circuit 10' pursuant to the present invention is depicted in FIG. 2. Circuit 10' includes CMOS logic 12 and bipolar circuits 14', which again partially share a common power supply rail $V_{DD}$ such that a logic current component $I_L$ and a bipolar circuit current component $I_{BP}$ together define the current between rail $V_{DD}$ and ground GND. Pursuant to the present invention, an IDD test detect/shutoff circuit 20 is connected to receive as inputs the two power supply voltages $V_{DD}$ and $V_{TT}$ to BiCMOS circuit 10'. Output from circuit 20 are complementary signals PF and NF (i.e., in this embodiment), one or both of which are fed back (shown in phantom) to appropriate pathways of circuits 14'. Signals PF and NF are employed by pass gates (see FIGS. 5a & 5b below) disposed within circuits 14' to temporarily switch "off" during IDD testing those bipolar circuit pathways coupled between power supply voltage $V_{DD}$ and ground potential, i.e., first circuit portion pathways and pass gates 15'.

Figure 3:
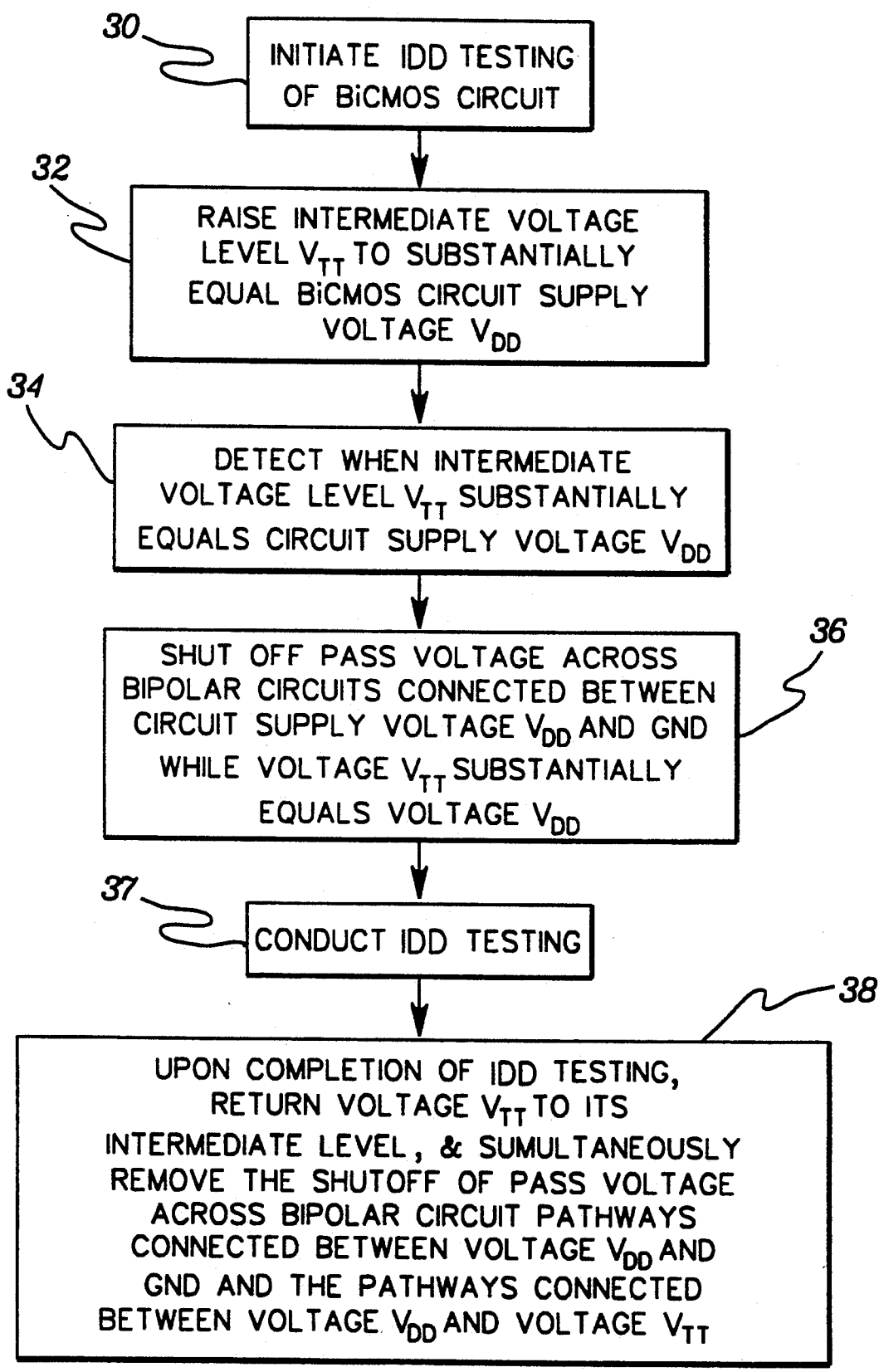
FIG. 3 is an operational flowchart of one embodiment of test detection/shut off processing pursuant to the present invention.

Before discussing detect/shutoff circuitry 20 in detail, refer to FIG. 3 wherein an overview of one processing embodiment pursuant to the present invention is set forth. After initiating IDD testing of the BiCMOS circuit, 30 "Initiate IDD Testing of BiCMOS Circuit," the voltage level at intermediate supply $V_{TT}$ is preferably raised to approximately equal circuit supply voltage $V_{DD}$, 32 "Raise Intermediate Voltage Level $V_{TT}$ to Substantially Equal BiCMOS Circuit Supply Voltage $V_{DD}$." Raising intermediate voltage level $V_{TT}$ can be manually accomplished with (or prior to) initiation of IDD testing, or can be program controlled (e.g., via a voltage controller 19 (FIG. 2)) for automatic variation to initiate IDD testing of the BiCMOS circuit.

When the voltage level at rail $V_{TT}$ substantially equals supply voltage $V_{DD}$, 34 "Detect When Intermediate Voltage Level $V_{TT}$ Substantially Equals Circuit Supply Voltage $V_{DD}$," those bipolar circuit pathways connected between voltage rails $V_{DD}$ and $V_{TT}$ (i.e., second circuit portion pathways 17) are automatically turned off (i.e., current therethrough ceases because of the equalization of potential across the pathway). (As used herein, "substantially equals" means that the voltage difference between $V_{DD}$ and $V_{TT}$ is less than some predefined minimum threshold, V-test, V-test being equal to the lesser of the corresponding threshold voltage of the BiCMOS technology, or a value adequately small to reduce the bipolar current flowing from $V_{DD}$ to $V_{TT}$ to values which would not invalidate measurements of the logic portion of the IDD test, e.g., 0.1 volts.) Simultaneous therewith, action is taken to shutoff voltage across bipolar circuit pathways connected between supply voltage $V_{DD}$ and ground voltage GND, 36 "Shut off Pass Voltage Across Bipolar Circuits Connected Between Circuit Supply Voltage $V_{DD}$ and GND While Voltage $V_{TT}$ Substantially Equals Voltage $V_{DD}$." As noted, the pass voltage remains shut down while the two potentials remain in this substantially equal state.

Upon completion of IDD testing, 37 "Conduct IDD Testing, voltage $V_{TT}$ is returned to its normal intermediate level, which simultaneously removes shut down of the pass voltage across the bipolar circuit pathways connected between voltage $V_{DD}$ and ground GND (i.e., first circuit portion pathways 15'), and the bipolar circuit pathways connected between voltage $V_{DD}$ and voltage $V_{TT}$ (i.e., second circuit portion pathways 17), 38 "Upon Completion of IDD Testing, Return Voltage $V_{TT}$ To Its Intermediate Level & Simultaneously Remove The Shut Off of Pass Voltage Across The Bipolar Circuit Pathways Connected Between Voltage $V_{DD}$ and GND and The Pathways Connected Between Voltage $V_{DD}$ and Voltage $V_{TT}$."

Again, shut down of current through the bipolar circuit pathways 17 connected between supply voltage $V_{DD}$ and voltage $V_{TT}$ is advantageously inherently accomplished simply by raising the voltage at intermediate supply $V_{TT}$ to substantially equal supply voltage $V_{DD}$. Shut down of current through those bipolar circuit pathways 15 connected between supply voltage $V_{DD}$ and ground is accomplished pursuant to the present invention using one or both of the signals (PF and NF) generated by the test detector/shutoff 20 of FIG. 2.

Figure 4:
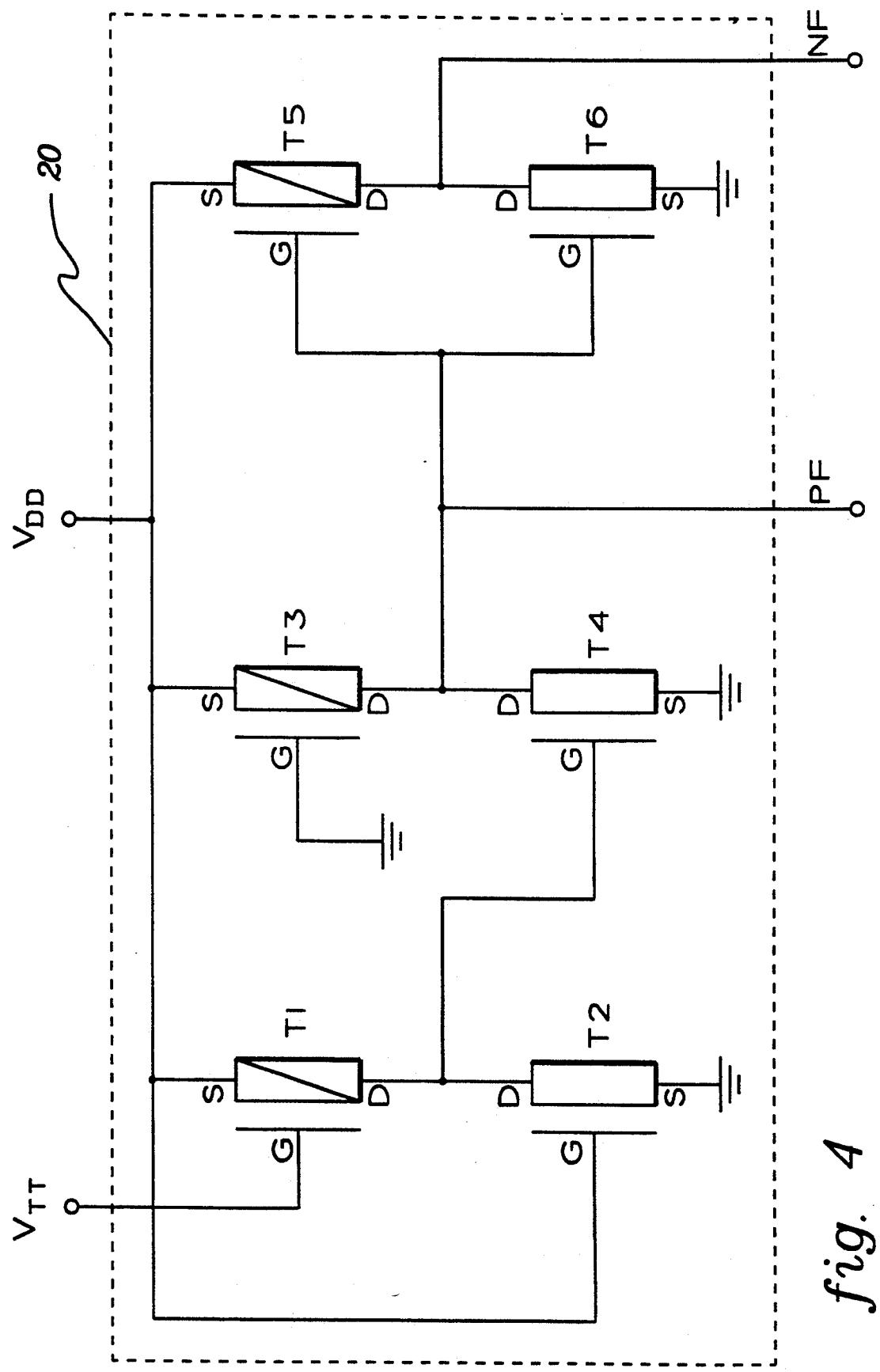
FIG. 4 is a schematic of one embodiment of the IDD test detect and shut off circuit of FIG. 2.

One detailed embodiment for detector/shutoff 20 is depicted in FIG. 4. In this embodiment, circuit 20 includes complementary metal-oxide semiconductor (CMOS) circuits with P-channel field-effect transistors (PFETs) indicated in the drawing by a rectangle with a diagonal line formed therein and a control element or gate electrode arranged adjacent thereto and with N-channel field-effect transistors (NFETs) indicted by a rectangle without a diagonal line formed therein but with a control element or gate electrode arranged adjacent thereto.

A first PFET T1 has its source "S" connected to circuit voltage $V_{DD}$ and its drain "D" connected to the drain "D" of an NFET T2. PFET T1 is gated "G" by the intermediate power supply voltage $V_{TT}$. NFET T2 has its source "S" connected to ground and its gate "G" wired to power supply voltage $V_{DD}$. The node formed at the common drain connection is connected to the gate "G" of a second NFET T4, which has its source "S" connected to ground and its drain "D" connected to the drain "D" of a second PFET T3. This second common drain connection forms a first output node. As with PFET T1, PFET T3 has its source "S" connected to power supply voltage $V_{DD}$, while the gate "G" to PFET T3 is grounded. A first output from circuit 20, i.e, signal PF, is taken from the first output node defined by the commonly coupled drains of NFET T4 and PFET T3.

A complementary output signal NF is obtained by passing signal PF through an inverter circuit comprising a PFET T5 and an NFET T6. As shown, signal PF is fed in parallel to the gates "G" of PFET T5 and NFET T6 such that the same signal gates both devices. The source "S" of PFET T5 is tied to power supply voltage $V_{DD}$ and the drains "D" of PFET T5 and NFET T6 are commonly connected to define a second output node. The source "S" of NFET T6 is grounded. The complementary signal NF is obtained at the second output node defined by the commonly connected drains of PFET T5 and NFET T6.

In operation, IDD testing begins with the voltage at intermediate supply $V_{TT}$ being raised to approximately equal that of voltage $V_{DD}$. In so doing, those bipolar circuit pathways 17 coupled between power supply voltage $V_{DD}$ and intermediate supply $V_{TT}$ are automatically shut off such that there is no current passing therethrough. The remaining pathways 15' in bipolar circuits 14' are assumed to be coupled between power supply voltage $V_{DD}$ and a ground potential GND. These pathways are actively switched off by circuit 20 simultaneous with detection of the IDD test condition. A truth table for IDD switch circuit 20 is shown in Table 1.

TABLE 1

| Condition | $V_{DD}(V)$ | $V_{TT}(V)$ | PF | NF |
|---|---|---|---|---|
| Burn-in | 5.4 | 3.3 | 0 | 1 |
| Functional | 3.6 | 1.5 | 0 | 1 |
| IDD Test | 3.6 | 3.6 | 1 | 0 |

Figure 5A:
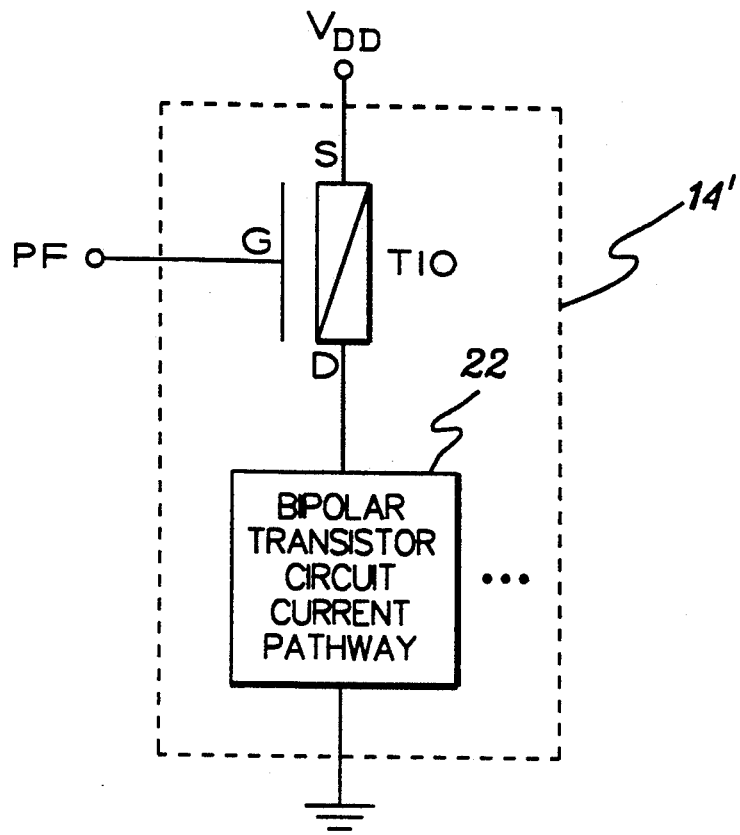
FIGS. 5a & 5b each schematically depict one embodiment for implementing a bipolar circuit pass switch pursuant to the present invention.

Different types of pass gate shutoff switches may be employed. By way of example, FIG. 5a shows a first pass gate which comprises a PFET T10 gated "G" by signal PF produced by circuit 20. The source "S" of PFET T10 is connected to power supply voltage $V_{DD}$ and its drain "D" to the positive supply input to a bipolar circuit path 22 consisting of one pathway within bipolar circuit 14'. The output from path 22 is connected to ground. Thus, when signal PF is high, representative of an IDD test condition (again, detected by equal voltages at inputs $V_{DD}$ and $V_{TT}$ to circuit 20 (FIGS. 2 & 4)), pass gate T10 turns off thereby opening the pathway between power supply voltage $V_{DD}$ and ground potential GND and eliminating any bias current through this particular bipolar circuit path 22. When signal PF is low, a short circuit essentially exists across PFET T10.

Figure 5B:
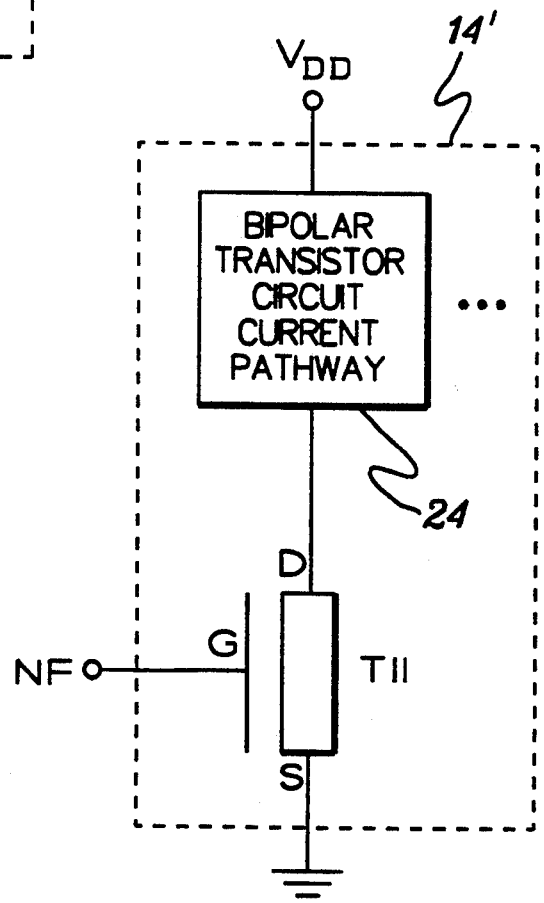

An alternate embodiment for a shutoff switch pursuant to the present invention is depicted in FIG. 5b. This pass gate embodiment comprises an NFET T11 which is gated "G" by complementary signal NF from circuit 20. (Signal NF is low when an IDD test condition is detected by the detect and shut off circuit 20 (FIG. 4).) NFET T11 is connected between the negative return of bipolar circuit path 24 and ground potential GND at its drain "D" and source "S", respectively. The input to bipolar circuit path 24 is connected to power supply voltage $V_{DD}$. Thus, when detect circuit 20 identifies an IDD test condition, a low NF signal is generated and applied to the pass gate, turning NFET T11 "off" and opening the connection of path 24 to ground GND. When signal NF is high, NFET T11 provides a short circuit to ground.

Alternate switching circuits besides pass gates PFET T10 and NFET T11 are also possible. The objective is to open during IDD testing the current path between voltage supply $V_{DD}$ and ground GND for each bipolar circuit path (e.g., path 22 (FIG. 5a) & path 24 (FIG. 5b)) in circuits 14' (FIG. 2), to thereby isolate these circuits 15' from the BiCMOS logic and eliminate bipolar current $I_{BP}$ during IDD testing. During normal circuit operation, the switch should comprise a short circuit.

Those skilled in the art will recognize from the above description that a novel IDD test detector/shutoff and method for BiCMOS devices is presented herein. The test detect and shut off circuit allows the performance of meaningful IDD testing of a chip having a common power rail for both CMOS logic and bipolar circuit pathways (e.g., ECL I/Os). By improving testing, the innovative technique presented will save time, improve chip reliability and chip yields. The costs to implement are minimal and the monitor/circuit shutoff may be embedded in an I/O cell, thereby not requiring any chip image redesigns.

While the invention has been described in detail herein in accordance with certain preferred embodiments thereof, many modifications and changes therein may be affected by those skilled in the art. Accordingly, it is intended by the appended claims to cover all such modifications and changes as fall within the true spirit and scope of the invention.

We claim:

1. A test detect and shut off circuit for facilitating testing of a BiCMOS integrated circuit having a single first power rail supplying operating circuit voltage $V_{DD}$ and a second power rail supplying intermediate voltage $V_{TT}$ (wherein under normal integrated circuit operation $V_{DD} > V_{TT}$), said BiCMOS integrated circuit including a logic portion connected between the first power rail supplying voltage $V_{DD}$ and a ground voltage GND, and a bipolar transistor circuit having multiple current pathways, at least one of said current pathways being connected in parallel with the logic portion between the first power rail supplying voltage $V_{DD}$ and the ground voltage GND, and at least one of said current pathways being connected between the first power rail supplying voltage $V_{DD}$ and the second power rail supplying intermediate voltage $V_{TT}$, said test detect and shut off circuitry comprising:
   a detect circuit electrically coupled to said BiCMOS integrated circuit for detecting the presence of a predetermined test condition in said BiCMOS integrated circuit and for generating in response thereto a test detect signal; and
   a shut off circuit electrically coupled to said BiCMOS integrated circuit and to said detect circuit for opening the at least one bipolar transistor circuit current pathway connected between the first power rail supplying voltage $V_{DD}$ and ground voltage GND in response to generation of said test detect signal by said detect circuit such that bias current in said at least one bipolar transistor circuit current pathway is eliminated, thereby facilitating testing of the logic portion of said BiCMOS integrated circuit.

2. The test detect and shut off circuit of claim 1, wherein said test to be facilitated comprises IDD testing of the logic portion of said BiCMOS integrated circuit.

3. The test detect and shut off circuit of claim 2, wherein said predetermined test condition comprises approximately equal voltage levels being supplied by said first power rail and said second power rail.

4. The test detect and shut off circuit of claim 2, wherein said predetermined test condition comprises a predefined minimum voltage difference between said supplied voltage $V_{DD}$ and said supplied voltage $V_{TT}$.

5. The test detect and shut off circuit of claim 1, wherein said shut off circuit comprises at least one field effect transistor connected in series with said at least one bipolar transistor circuit current pathway in parallel with said logic portion between said first power rail supplying voltage $V_{DD}$ and said ground voltage GND, said at least one field effect transistor being coupled to receive said test detect signal generated by said detect circuit and function as a pass gate.

6. A BiCMOS integrated circuit having a test detect and bipolar circuit shutoff for facilitating IDD testing of a logic portion of said BiCMOS integrated circuit, said BiCMOS integrated circuit comprising:
   a single first power input for supplying operating circuit voltage $V_{DD}$ to said BiCMOS integrated circuit;
   a field effect transistor circuit connected between said first power input supplying voltage $V_{DD}$ and a ground voltage GND, said field effect transistor circuit comprising said logic portion of said BiCMOS integrated circuit;
   a bipolar transistor circuit having a first circuit portion comprising multiple current pathways connected in parallel with said field effect transistor circuit between said first power input supplying voltage $V_{DD}$ and said ground voltage GND;
   a second power input for supplying an intermediate circuit voltage $V_{TT}$ (wherein under normal integrated circuit operation $V_{DD} > V_{TT} > GND$) to a second circuit portion of said bipolar transistor circuit connected between said first power input supplying voltage $V_{DD}$ and said second power input supplying voltage $V_{TT}$; and
   detect/shutoff circuitry coupled to said bipolar transistor circuit for detecting the presence of a predetermined test condition in said BiCMOS integrated circuit, and upon detection of said predetermined test condition for switching off said current pathways of said first circuit portion of said bipolar transistor circuit connected between said first power input supplying voltage $V_{DD}$ and said ground voltage GND such that quiescent current in said current pathways of said first circuit portion is eliminated, thereby facilitating IDD testing of said logic portion of said BiCMOS integrated circuit.

7. The BiCMOS integrated circuit of claim 6, wherein said predetermined test condition comprises approximately equal voltage values being supplied at said single first power input ($V_{DD}$) and said second power input ($V_{TT}$), and wherein said BiCMOS integrated circuit further includes means for approximately equalizing the voltage values supplied at said first power input and said second power input.

8. The BiCMOS integrated circuit of claim 7, wherein said means for approximately equalizing voltage $V_{DD}$ and voltage $V_{TT}$ comprises means for raising voltage value $V_{TT}$ at said second power input to substantially equal said voltage value $V_{DD}$ supplied at said single first power input.

9. The BiCMOS integrated circuit of claim 8, wherein said predetermined test condition comprises a predefined minimum voltage difference between said supplied voltage $V_{DD}$ and said supplied voltage $V_{TT}$.

10. The BiCMOS integrated circuit of claim 6, wherein said detect/shutoff circuitry for switching off said first circuit portion pathways of said bipolar transistor circuit connected between said first power input supplying voltage $V_{DD}$ and said ground voltage GND includes for each current pathway of said first circuit portion pathways a field effect transistor connected in series therewith so as to function as a pass gate.

11. The BiCMOS integrated circuit of claim 6, wherein said field effect transistor circuit comprises a CMOS logic circuit connected between said single first power input supplying voltage $V_{DD}$ and said ground voltage GND.

12. The BiCMOS integrated circuit of claim 6, wherein an operating circuit voltage $V_{DD}$ supplied by said first power input comprises 3.6 volts and an operating circuit voltage $V_{TT}$ supplied by said second power input comprises 1.5 volts.

13. A method for IDD testing of a logic portion of a BiCMOS integrated circuit, said BiCMOS integrated circuit including a logic transistor circuit and a bipolar transistor circuit, said logic transistor circuit being coupled between a single operating circuit supply voltage $V_{DD}$ and a ground voltage GND, said bipolar transistor circuit being connected between said supply voltage $V_{DD}$ and a second intermediate supply voltage $V_{TT}$ (wherein under normal BiCMOS integrated circuit operation $V_{DD} > V_{TT}$), said testing method comprising the steps of:

(a) reducing the voltage difference between said operating supply voltage $V_{DD}$ and said intermediate supply voltage $V_{TT}$ so as to disable the bipolar transistor circuit connected between said supply voltage $V_{DD}$ and said supply voltage $V_{TT}$; and (b) simultaneous with said step (a), conducting IDD testing of said logic transistor circuit, whereby testing of said logic transistor circuit proceeds independent of said bipolar transistor circuit.

14. The testing method of claim 13, wherein said reducing step (a) comprises raising the voltage level of said intermediate supply voltage $V_{TT}$ to approximately equal said operating supply voltage $V_{DD}$.

* * * * *

UNITED STATES PATENT AND TRADEMARK OFFICE
CERTIFICATE OF CORRECTION

PATENT NO. : 5,294,883
DATED : Mar. 15, 1994
INVENTOR(S) : Akiki et al.

It is certified that error appears in the above-indentified patent and that said Letters Patent is hereby corrected as shown below:

<u>Cover Page</u>:

Under "Primary Examiner - Vinh Nguyen" insert
--Attorney, Agent or Firm - Heslin & Rothenberg, P.C.--.

Column 5, line 48 between "Testing" and "," insert --"--.
Column 5, line 67 delete "15" and insert therefor --15'--.

Signed and Sealed this

Nineteenth Day of July, 1994

Attest:

BRUCE LEHMAN

*Attesting Officer*     *Commissioner of Patents and Trademarks*